US011539353B2

United States Patent
Shehata et al.

(10) Patent No.: US 11,539,353 B2
(45) Date of Patent: Dec. 27, 2022

(54) RTWO-BASED FREQUENCY MULTIPLIER

(71) Applicant: Analog Devices International Unlimited Company, Limerick (IE)

(72) Inventors: Mohamed A. Shehata, Dublin (IE); James Breslin, Ennis (IE); Michael F. Keaveney, lisnagry (IE); Hyman Shanan, Franklin Park, NJ (US)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 17/443,233

(22) Filed: Jul. 22, 2021

(65) Prior Publication Data
US 2022/0247396 A1     Aug. 4, 2022

Related U.S. Application Data

(60) Provisional application No. 63/199,912, filed on Feb. 2, 2021.

(51) Int. Cl.
| | | |
|---|---|---|
| *H03B 5/18* | (2006.01) | |
| *H03K 5/00* | (2006.01) | |
| *G04F 10/00* | (2006.01) | |

(52) U.S. Cl.
CPC ....... *H03K 5/00006* (2013.01); *G04F 10/005* (2013.01); *H03B 5/1841* (2013.01);
(Continued)

(58) Field of Classification Search
CPC .............. H03K 5/00006; G04F 10/005; H03B 5/1841; H03B 2200/0016; H03B 2201/0208
(Continued)

(56) References Cited

U.S. PATENT DOCUMENTS

| | | |
|---|---|---|
| 3,516,021 A | 6/1970 | Kohn |
| 3,538,450 A | 11/1970 | Andrea et al. |
| | (Continued) | |

FOREIGN PATENT DOCUMENTS

| | | |
|---|---|---|
| CN | 102624334 A | 8/2012 |
| CN | 102104363 B | 1/2013 |
| | (Continued) | |

OTHER PUBLICATIONS

Abbasaozadeh, Soolmaz, "Thermal and flicker phase noise analysis in rotary traveling-wave oscillator," International Journal of Circuit Theory and Applications, Jul. 2019, in 17 pages.
(Continued)

*Primary Examiner* — Ryan Jager
(74) *Attorney, Agent, or Firm* — Knobbe, Martens, Olson & Bear, LLP

(57) ABSTRACT

Rotary traveling wave oscillator-based (RTWO-based) frequency multipliers are provided herein. In certain embodiments, an RTWO-based frequency multiplier includes an RTWO that generates a plurality of clock signal phases of a first frequency, and an edge combiner that processes the clock signal phases to generate an output clock signal having a second frequency that is a multiple of the first frequency. The edge combiner can be implemented as a logic-based combining circuit that combines the clock signal phases from the RTWO. For example, the edge combiner can include parallel stacks of transistors operating on different clock signal phases, with the stacks selectively activating based on timing of the clock signal phases to generate the output clock signal of multiplied frequency.

20 Claims, 9 Drawing Sheets

(52) U.S. Cl.
CPC ............... *H03B 2200/0016* (2013.01); *H03B 2201/0208* (2013.01)

(58) Field of Classification Search
USPC ........................................................ 327/116
See application file for complete search history.

(56) References Cited

U.S. PATENT DOCUMENTS

| | | |
|---|---|---|
| 4,246,550 A | 1/1981 | Cohen |
| 4,246,555 A | 1/1981 | Williams |
| 4,514,707 A | 4/1985 | Dydyk et al. |
| 4,686,407 A | 8/1987 | Ceperley |
| 4,749,963 A | 6/1988 | Makimoto et al. |
| 4,875,046 A | 10/1989 | Lewyn |
| 5,117,206 A | 5/1992 | Imamura |
| 5,235,335 A | 8/1993 | Hester et al. |
| 5,302,920 A | 4/1994 | Bitting |
| 5,361,277 A | 11/1994 | Grover |
| 5,493,715 A | 2/1996 | Humphreys et al. |
| 5,546,023 A | 8/1996 | Borkar et al. |
| 5,584,067 A | 12/1996 | V. Buer et al. |
| 5,592,126 A | 1/1997 | Boudewijns et al. |
| 5,640,112 A | 6/1997 | Goto et al. |
| 5,652,549 A | 7/1997 | Unterricker et al. |
| 5,754,833 A | 5/1998 | Singh et al. |
| 5,825,211 A | 10/1998 | Smith et al. |
| 5,945,847 A | 8/1999 | Ransijn |
| 5,963,086 A | 10/1999 | Hall |
| 5,973,633 A | 10/1999 | Hester |
| 6,002,274 A | 12/1999 | Smith et al. |
| 6,078,202 A | 6/2000 | Tomatsuri et al. |
| 6,133,798 A | 10/2000 | Nagano et al. |
| 6,150,886 A | 11/2000 | Shimomura |
| 6,157,037 A | 12/2000 | Danielson |
| 6,239,663 B1 | 5/2001 | Mizutani |
| 6,249,189 B1 | 6/2001 | Wu et al. |
| 6,259,327 B1 | 7/2001 | Balistreri et al. |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,525,618 B2 | 2/2003 | Wood |
| 6,556,089 B2 | 4/2003 | Wood |
| 6,566,968 B2 | 5/2003 | Aghahi |
| 6,574,288 B1 | 6/2003 | Welland et al. |
| 6,683,503 B2 | 1/2004 | Mizuno et al. |
| 6,781,424 B2 | 8/2004 | Lee et al. |
| 6,816,020 B2 | 11/2004 | Wood |
| 6,856,208 B2 | 2/2005 | Lee et al. |
| 6,870,431 B2 | 3/2005 | Afghahi |
| 6,900,699 B1 | 5/2005 | Kim |
| 6,909,127 B2 | 6/2005 | O'Mahony et al. |
| 6,943,599 B2 * | 9/2005 | Ngo .......................... H03L 7/18 327/159 |
| 6,995,620 B2 | 2/2006 | Afghahi |
| 7,005,930 B1 | 2/2006 | Kim et al. |
| 7,085,668 B2 | 8/2006 | Johnson |
| 7,088,154 B2 | 8/2006 | Ngo |
| 7,091,802 B2 | 8/2006 | Ham et al. |
| 7,130,604 B1 | 10/2006 | Wong et al. |
| 7,203,914 B2 | 4/2007 | Wood |
| 7,209,065 B2 | 4/2007 | Wood |
| 7,224,199 B1 | 5/2007 | Kang |
| 7,224,235 B2 | 5/2007 | De Ranter et al. |
| 7,236,060 B2 | 6/2007 | Wood |
| 7,242,272 B2 | 7/2007 | Ham et al. |
| 7,274,262 B2 | 9/2007 | Ham et al. |
| 7,280,001 B2 | 10/2007 | Maligeorgos et al. |
| 7,295,076 B2 | 11/2007 | Kim et al. |
| 7,307,483 B2 | 12/2007 | Tzartzanis et al. |
| 7,315,219 B2 | 1/2008 | Chiang |
| 7,339,439 B2 | 3/2008 | Roubadia et al. |
| 7,378,893 B1 | 5/2008 | Kang |
| 7,397,230 B2 | 7/2008 | Tabaian et al. |
| 7,409,012 B2 | 8/2008 | Martin et al. |
| 7,439,777 B2 | 10/2008 | Wood |
| 7,446,578 B2 | 11/2008 | Huang |
| 7,471,153 B2 | 12/2008 | Kee et al. |
| 7,482,850 B2 * | 1/2009 | Kawamoto ............... H03L 7/10 327/158 |
| 7,482,884 B2 | 1/2009 | Wang et al. |
| 7,504,895 B2 | 3/2009 | Neidorff |
| 7,511,588 B2 | 3/2009 | Gabara |
| 7,513,873 B2 | 4/2009 | Shifrin |
| 7,515,005 B2 | 4/2009 | Dan |
| 7,541,794 B2 | 6/2009 | Tabaian et al. |
| 7,545,225 B2 | 6/2009 | Beccue |
| 7,551,038 B2 | 6/2009 | Jang et al. |
| 7,571,337 B1 | 8/2009 | Zhai et al. |
| 7,577,225 B2 | 8/2009 | Azadet et al. |
| 7,609,756 B2 | 10/2009 | Wood |
| 7,612,621 B2 | 11/2009 | Kim et al. |
| 7,616,070 B2 | 11/2009 | Tzartzanis et al. |
| 7,656,239 B2 | 2/2010 | Bietti et al. |
| 7,656,336 B2 | 2/2010 | Wood |
| 7,656,979 B2 | 2/2010 | Leydier et al. |
| 7,663,328 B2 | 2/2010 | Gonder |
| 7,675,334 B2 * | 3/2010 | Kawamoto ............... H03L 7/10 331/25 |
| 7,715,143 B2 | 5/2010 | Bliss et al. |
| 7,741,921 B2 | 6/2010 | Ismailov |
| 7,782,988 B2 | 8/2010 | Ziesler |
| 7,805,697 B2 | 9/2010 | Wood |
| 7,833,158 B2 | 11/2010 | Bartz |
| 7,847,643 B2 | 12/2010 | Da Dalt |
| 7,885,625 B2 | 2/2011 | Muhammad et al. |
| 7,893,778 B2 | 2/2011 | Mohtashemi et al. |
| 7,907,023 B2 | 3/2011 | Liang et al. |
| 7,911,284 B2 | 3/2011 | Kuwano |
| 7,924,076 B2 | 4/2011 | Suzuki et al. |
| 7,936,193 B2 | 5/2011 | Van Der Wel et al. |
| 7,944,316 B2 | 5/2011 | Watanabe et al. |
| 7,952,439 B1 | 5/2011 | Heggemeier et al. |
| 7,973,609 B2 | 7/2011 | Ohara et al. |
| 7,978,012 B2 | 7/2011 | Wood |
| 7,995,364 B2 | 8/2011 | Shiu |
| 8,008,981 B2 | 8/2011 | Hong et al. |
| 8,049,563 B2 | 11/2011 | Aoki et al. |
| 8,089,322 B2 | 1/2012 | Martchovsky et al. |
| 8,115,560 B2 | 2/2012 | Chung |
| 8,169,267 B2 | 5/2012 | De Mercey |
| 8,193,870 B2 | 6/2012 | Takinami et al. |
| 8,351,558 B2 * | 1/2013 | Strandberg ............... H04L 27/18 327/39 |
| 8,410,858 B2 | 4/2013 | Wood |
| 8,629,807 B2 | 1/2014 | Wood et al. |
| 8,742,857 B2 | 6/2014 | Martchovsky et al. |
| 8,895,913 B2 | 11/2014 | Tekin et al. |
| 9,209,745 B2 | 12/2015 | Beccue |
| 9,473,069 B1 | 10/2016 | Beccue |
| 9,806,701 B1 * | 10/2017 | Bellaouar ............ H03K 5/1534 |
| 9,838,026 B2 * | 12/2017 | Van Brunt ............. H03L 7/099 |
| 10,277,233 B2 * | 4/2019 | Shanan .................. H03L 7/0995 |
| 10,312,922 B2 | 6/2019 | Shanan |
| 10,567,154 B1 | 2/2020 | Wentzloff et al. |
| 10,608,652 B2 * | 3/2020 | Zerbe .................. H03K 3/0315 |
| 10,756,741 B2 * | 8/2020 | Shanan ................. H03B 5/1841 |
| 2003/0128075 A1 | 7/2003 | Wood |
| 2003/0151465 A1 | 8/2003 | Wood |
| 2004/0233022 A1 | 11/2004 | Tsuzuki et al. |
| 2005/0068116 A1 | 3/2005 | Ham |
| 2006/0208776 A1 | 9/2006 | Tonietto et al. |
| 2007/0030041 A1 * | 2/2007 | Huang ................. H03L 7/0891 327/158 |
| 2008/0074202 A1 | 3/2008 | Gabara |
| 2008/0252386 A1 | 10/2008 | Kim |
| 2009/0215423 A1 | 8/2009 | Hwang et al. |
| 2009/0322394 A1 | 12/2009 | Song et al. |
| 2010/0066416 A1 | 3/2010 | Ohara et al. |
| 2010/0117744 A1 | 5/2010 | Takinami et al. |
| 2010/0156549 A1 | 6/2010 | Uemura et al. |
| 2010/0321121 A1 | 12/2010 | Mohtashemi |
| 2011/0095833 A1 | 4/2011 | Mohtashemi et al. |

(56) References Cited

U.S. PATENT DOCUMENTS

| | | |
|---|---|---|
| 2011/0156760 A1 | 6/2011 | Bhuiyan et al. |
| 2011/0156773 A1 | 6/2011 | Beccue |
| 2011/0195683 A1 | 8/2011 | Brekelmans et al. |
| 2011/0286510 A1 | 11/2011 | Levantino et al. |
| 2012/0008717 A1 | 1/2012 | van Sinderen et al. |
| 2012/0013363 A1 | 1/2012 | Takinami et al. |
| 2012/0013407 A1 | 1/2012 | Takinami et al. |
| 2012/0025918 A1 | 2/2012 | Wang et al. |
| 2012/0112841 A1 | 5/2012 | Hayashi |
| 2012/0185623 A1 | 7/2012 | Ross et al. |
| 2012/0212297 A1 | 8/2012 | Le Grand De Mercey et al. |
| 2013/0058384 A1* | 3/2013 | Otis ............... H03K 5/00006 375/327 |
| 2013/0151465 A1 | 6/2013 | Baumgaertel |
| 2013/0154750 A1 | 6/2013 | Martchovsky |
| 2013/0271190 A1 | 10/2013 | Booth et al. |
| 2014/0362952 A1* | 12/2014 | Cheng ................ H04L 27/12 375/303 |
| 2016/0204764 A1 | 7/2016 | Ferriss |
| 2018/0102781 A1 | 4/2018 | Shanan |
| 2018/0102782 A1 | 4/2018 | Shanan |
| 2019/0273468 A1 | 9/2019 | Dogan et al. |
| 2019/0393882 A1* | 12/2019 | Bassi ............... H03K 3/0315 |
| 2020/0229088 A1* | 7/2020 | Wang ............... H04W 52/0225 |
| 2021/0091721 A1* | 3/2021 | Shehata ............. H03B 5/1852 |
| 2022/0045410 A1* | 2/2022 | Chuang ............... H01P 3/02 |

FOREIGN PATENT DOCUMENTS

| | | |
|---|---|---|
| DE | 4322701 C1 | 8/1994 |
| EP | 0633662 A1 | 1/1995 |
| EP | 0696843 A1 | 2/1996 |
| EP | 0478134 B1 | 6/1997 |
| EP | 0583839 A1 | 11/1997 |
| EP | 0891045 B1 | 1/2002 |
| EP | 1 426 983 A1 | 6/2004 |
| GB | 1247199 | 9/1971 |
| GB | 2358562 | 7/2001 |
| JP | 60224205 | 11/1985 |
| JP | 4165809 | 6/1992 |
| JP | 2001274629 A | 10/2001 |
| WO | WO 95/12263 | 5/1995 |
| WO | WO 00/44093 | 7/2000 |
| WO | WO 2010/053215 A1 | 5/2010 |

OTHER PUBLICATIONS

Buadana et al., "A Triple Band Travelling Wave VCO Using Digitally Controlled Artificial Dielectric Transmission Lines" 2011 IEEE Radio Frequency Integrated Circuits Symposium, IEEE Xplore dated Jul. 5, 2011, in 4 pages.

Bubmann et al., "Active Compensation of Interconnect Losses of Multi-GHz Clock Distribution Networks," IEEE Transactions on Circuits and Systems—II: Analog and Digital Signal Processing, vol. 39, No. 11, Nov. 1992, pp. 790-798.

Chen, et al., "Rotary Traveling-Wave Oscillators, Analysis and Simulation," IEEE Transactions on Circuits and Systems—I: Regular Papers, vol. 58, No. 1, Jan. 2011, in 11 pages.

Chi et al., "A +2.3dBm 124-158GHz Class-F frequency quadrupler with folded-transformer based multi-phase driving," 2015 IEEE RFIC, Phoenix, AZ, 2015, pp. 263-266, in 4 pages.

Chien et al., "A 900-MHz Local Oscillator Using a DLL-Based Frequency Multiplier Technique for PCS Applications" IEEE Journal of Solid-State Circuits ( vol. 35, Issue: 12) dated Dec. 2000, in 4 pages.

Chien, et al., "A 32 GHz Rotary Traveling-Wave Voltage Controlled Oscillator in 0.18-µm CMOS," IEEE MWCL, vol. 17, No. 10, pp. 724-726, Oct. 2007.

Choi., "Fully-Integrated DLL/PLL-Based CMOS Frequency Synthesizers for Wireless Systems" dated Jul. 15, 2010, in 119 pages.

Chung et al., "A 10-40 GHz frequency quadrupler source with switchable bandpass filters and > 30 dBc harmonic rejection" 2017 IEEE Radio Frequency Integrated Circuits Symposium (RFIC), dated Jul. 7, 2017, in 4 pages.

Deutsch, et al., "Modeling and Characterization of Long On-Chip Interconnections for High-Performance Microprocessors," IBM J Res. Develop., vol. 39, No. 5, Sep. 1995, pp. 547-567.

Divina et al., "The Distributed Oscillator at 4 GHZ," IEEE, Department Electromagnetic Field, May 1998, Czech Technical University in Prague, Technicka 2, 166 27 Praha 6, Czech Republic, pp. 1-4.

Dunning, Jim, "An All-Digital Phase-Locked Loop with 50-Cycle Lock Time Suitable for High-Performance Microprocessors," IEEE Journal of Solid-State Circuits, vol. 30, No. 4, Apr. 1995, pp. 412-422.

Fujibayashi et al., "A 76- to 81-GHz Multi-Channel Radar Transceiver" IEEE Journal of Solid-State Circuits (vol. 52, Issue: 9, Sep. 2017) dated May 25, 2017, in 16 pages.

Guo, et al., "A 0.083 mm2 25.2-to-29.5 GHz Multi-LC-Trank Class-F234 VCO with a 189.6-dBc/Hz FOM," IEEE Solid State Circuits Letters, vol. 1, Issue 4, Apr. 2018.

Hall, et al., "Clock Distribution Using Cooperative Ring Oscillators," IEEE, Proceedings of the 17th Conference on Advanced Research in VLSI, Ann Arbor, MI (Sep. 15-16, 1997) pp. 62-75.

Hu, et al., "A Low-Flicker-Noise 30-GHz Class-F23 Oscillator in 28-nm CMOS using Implicit Resonance and Explicit Common-Mode Return Path," IEEE Journal of Solid-State Circuits, vol. 53, No. 7, Jul. 2018, in 11 pages.

Huang et al., "324GHz CMOS Frequency Generator Using Linear Superposition Technique," 2008 IEEE ISSCC, San Francisco, CA, 2008, pp. 476-629, in 3 pages.

Kato, Hatsuhiro, "A Dynamic Formulation of Ring Oscillator as Solitary-Wave Propagator," IEEE Transactions on Circuits and Systems—I: Fundamental Theory and Applications, vol. 45, No. 1, Jan. 1998, pp. 98-101.

Kim, et al., "A Low Phase-Noise CMOS LC Oscillator with a Ring Structure," 2000 IEEE International Solid-State Circuits Conference, 3 pages.

Kleveland, B. et al., "Line Inductance Extraction and Modeling in a Real Chip With Power Grid," IEEE IEDM Conference, 1999, Washington, D.C. pp 1-4.

Kleveland, et al., "50 GHz Interconnect Design in Standard Silicon Technology," IEEE MIT-S International Microwave Symposium, Baltimore, Maryland, Jun. 1998, 4 pages.

Kleveland, et al., "Monolithic CMOS Distributed Amplifier and Oscillator," 1999 IEEE International Solid-State Circuits Conference, 1999, 9 pages.

Kral, et al., "RF-CMOS Oscillators With Switched Tuning," Proceedings of the IEEE 1998 Custom Integrated Circuits Conference, pp. 555-558.

Ku et al., "A Milliwatt-Level 70-110 GHz Frequency Quadrupler with >30 dBc Harmonic Rejection" IEEE Transactions on Microwave Theory and Techniques (vol. 68, Issue: 5, May 2020) dated Feb. 5, 2020, in 9 pages.

Kucharski et al., "D-Band Frequency Quadruplers in BiCMOS Technology," in IEEE JSSC, vol. 53, No. 9, pp. 2465-2478, Sep. 2018, in 15 pages.

Larsson, Hakan, Distributed Synchronous Clocking Using Connected Ring Oscillators, Master's Thesis in Computer Systems Engineering, Centre for Computer Systems Architecture, Halmstad University: Halmstad, Sweden, Technical Report CCA-9705, Jan. 1997, pp. i-43.

Le Grand de Mercey 18GHZ=36GHZ Rotary Traveling Wave VCO in CMOS with I/O Outputs, 29th European Solid State Circuits Conference, Sep. 2003.

Le Grand de Mercey, Gregoire, 18GHZ=36GHZ Rotary Traveling Wave Voltage Controlled Oscillator in a CMOS Technology, Aug. 2004, in 135 pages.

M.A. Shehata, M.Keaveney and R.B.Staszewski, "A 184.6-dBc/Hz FoM 100-kHz Flicker Phase Noise Corner 30-GHz Rotary Traveling-Wave Oscillator Using Distributed Stubs in 22-nm FD-SOI," ESSCIRC 2019—IEEE 45th European Solid State Circuits Conference (ESSCIRC), Cracow, Poland, 2019, pp. 103-106, doi:10.1109/ESSCIRC.2019.8902916.

(56) References Cited

OTHER PUBLICATIONS

M.A. Shehata, M.Keaveney and R.B.Staszewski, "A 184.6-dBc/Hz FoM 100-kHz Flicker Phase Noise Corner 30-GHz Rotary Traveling-Wave Oscillator Using Distributed Stubs in 22-nm FD-SOI," in IEEE Solid-State Circuits Letters, vol. 2, No. 9, pp. 103-106, Sep. 2019, doi:10.1109/LSSC.2019.2929326.

Miller, Brian, "A Multiple Modulator Fractional Divider," IEEE Transactions on Instrumentation and Measurement, vol. 40, No. 3, Jun. 1991, pp. 578-583.

Moroni et al., "Analysis and Design of a 54 GHz Distributed "Hybrid" Wave Oscillator Array with Quadrature Outputs," IEEE Journal of Solid-State Circuits, vol. 49, No. 5, May 2014, in 15 pages.

Moroni et al., "Analysis and Design of a 54 GHz Distributed "Hybrid" Wave Oscillator Array with Quadrature Outputs" IEEE Journal of Solid-State Circuits (vol. 49, Issue: 5, May 2014) dated Mar. 31, 2014, in 15 pages.

Nagashino, Hirofumi, et al., "Generation of Traveling Wave Mode in a Chained Neural Oscillator Network Model," IEEE, Proc. of the Int. Conference on Neural Networks (ICNN), New York, Mar. 1993, pp. 1550-1557.

Nouri et al., "A 45-GHz Rotary-Wave Voltage-Controlled Oscillator," IEEE Transactions on Microwave Theory and Techniques, vol. 59, No. 2, Feb. 2011, in 10 pages.

Park et al., "76-81-GHz CMOS Transmitter with a Phase-Locked-Loop-Based Multichip Modulator for Automotive Radar" IEEE Transactions on Microwave Theory and Techniques (vol. 63, Issue: 4, Apr. 2015) dated Mar. 4, 2015, in 10 pages.

Rabbi et al., "A 42/84-GHz Multi-Ring Rotary Traveling-Wave Oscillator" 2019 SoutheastCon IEEE Xplore dated Mar. 5, 2020, in 5 pages.

Shehata et al., "A 32-42-GHz RTWO-Based Frequency Quadrupler Achieving >37 dBc Harmonic Rejection in 22-nm FD-SOI" IEEE Solid-State Circuits Letters, vol. 4, 2021, in 4 pages.

Shehata et al., "A Distributed Stubs Technique to Mitigate Flicker Noise Upconversion in a mm-Wave Rotary Traveling-Wave Oscillator" IEEE Journal of Solid-State Circuits dated Jan. 2021 in 16 pages.

Shehata et al., "A Distributed Stubs Technique to Mitigate Flicker Noise Upconversion in a mm-Wave Rotary Traveling-Wave Oscillator," in IEEE Journal of Solid-State Circuits, vol. 56, No. 6, pp. 1745-1760, Jun. 2021, doi: 10.1109/JSSC.2020.3044278.

Shehata et al., "Correction to A 32-42-GHz RTWO-Based Frequency Quadrupler Achieving>37 dBc Harmonic Rejection in 22-nm FD-SOI" IEEE Solid-State Circuits Letters, vol. 4, 2021, in 1 page.

Skvor, Z., et al., "Novel Decade Electronically Tunable Microwave Oscillator Based on the Distributed Amplifier," IEEE Explore, Electronic Letters, vol. 28, No. 17, Aug. 1992, pp. 1647-1648.

Takinami, Koji, "Phase-Noise Analysis in Rotary Traveling Wave Oscillators Using Simple Physical Model," IEEE Transactions on Microwave Theory and Techniques, vol. 58, No. 6, Jun. 2010, in 10 pages.

Vigilante, et al., "A Coupled RTWO-Based Subharmonic Receiver Front End for 5G E-Band Backhaul Links in 28-nm Bulk CMOS," IEEE Journal of Solid State Circuits, vol. 53, No. 10, Oct. 2018, in 12 pages.

Wang et al., "A 9% power efficiency 121-to-137GHz phase-controlled push-push frequency quadrupler in 0.13 m SiGe BiCMOS," 2012 IEEE ISSCC, San Francisco, CA, 2012, pp. 262-264, in 3 pages.

Wang et al., "Delay-locked Loop Based Frequency quadrupler with wide operating range and fast locking characteristics" 2016 IEEE International Symposium on Circuits and Systems (ISCAS) dated Aug. 11, 2016 in 4 pages.

Wang, Weihu "Systematic Optimization of Phase Noise of Voltage-Controlled Oscillators for Millimeter-Wave Radar" dated Nov. 21, 2017, in 153 pages.

Wilson, et al., "A CMOS Self-Calibrating Frequency Synthesizer," IEEE Journal of Solid-State Circuits, vol. 35, No. 10, Oct. 2000, pp. 1437-1444.

Wood, John, et al., "Rotary Traveling-Wave Oscillator Arrays: A New Clock Technology," IEEE Journal of Solid-State Circuits, vol. 36, No. 11, Nov. 2001, in 12 pages.

Wu, et al., "E-Band Multi-Phase LC Oscillators with Rotated-Phase-Tuning Using Implicit Phase Shifters," IEEE JSSC, vol. 53, No. 9, pp. 2560-2571, Sep. 2018.

Yabuki, Hiroyuki, et al., "Miniaturized Stripline Dual-Mode Ring Resonators and Their Application to Oscillating Devices," IEEE MIT-S International Microwave Symposium Digest, New York, May 16. 1995, pp. 1313-1316.

Yue, et al., "On-Chip Spiral Inductors with Patterned Ground Shields for Si-Based RF IC's," IEEE Journal of Solid-State Circuits, vol. 33, No. 5, 1998, pp. 743-752.

Zirath et al., "Development of 60-GHz front-end circuits for a high-data-rate communication system," IEEE JSSC, vol. 39, No. 10, pp. 1640-1649, Oct. 2004, in 10 pages.

Gathman et al., "A92-GHz Deterministic Quadrature Oscillator and N-Push Modulator in 120-nm SiGe BiCMOS", IEEE—MTTS International Microwave Symposium Digest dated Jun. 2, 2013 in 4 pages.

Huang et al. "A DLL-Based Programmable Clock Generator Using Threshold-Trigger Delay Element and Circular Edge Combiner", Advanced System Integrated Circuits 2004. Proceedings of 2004 IEEE ASI A-Pacific Conference dated Aug. 4, 2004, pp. 76-79.

International Search Report and Written Opinion for International Application No. PCT/EP2022/050888 dated May 3, 2022, in 16 pages.

Shehata et al., "A 32-42-GHz RTWO-Based Frequency Quadrupler Achieving >37 dBc Harmonic Rejection in 22-nm FD-SOI", IEEE Solid-State Circuits Letters, IEEE, vol. 4, Jan. 29, 2021, pp. 72-75.

\* cited by examiner

RTWO-BASED FREQUENCY MULTIPLIER

CROSS-REFERENCE TO RELATED APPLICATIONS

The present application claims priority to U.S. Provisional Patent Application No. 63/199,912, filed Feb. 2, 2021 and titled "RTWO-BASED FREQUENCY MULTIPLIER," the entirety of which is hereby incorporated herein by reference.

FIELD

Embodiments of the invention relate to electronic systems, and more particularly, to frequency multipliers.

BACKGROUND

A rotary traveling wave oscillator (RTWO) is a type of electronic oscillator in which a traveling wave moves around a closed differential loop that includes a crossover for reversing the polarity of the traveling wave each transit of the loop. Additionally, the traveling wave's energy is preserved by maintaining amplifiers distributed around the loop. At any point along the loop, a differential clock signal is available by tapping the loop. The frequency of the differential clock signal is determined by the time taken by the traveling wave to propagate around the loop, and the phase of the differential clock signal is determined by the position along the loop that the differential clock signal is tapped from.

RTWOs can be used in a variety of applications, including, for example, radio frequency systems, optical networks, and/or chip-to-chip communication. For instance, an RTWO can be used in a frequency synthesizer to generate an output clock signal having a controlled phase and frequency relationship to a reference clock signal.

SUMMARY OF THE DISCLOSURE

RTWO-based frequency multipliers are provided herein. In certain embodiments, an RTWO-based frequency multiplier includes an RTWO that generates a plurality of clock signal phases of a first frequency, and an edge combiner that processes the clock signal phases to generate an output clock signal having a second frequency that is a multiple of the first frequency. The edge combiner can be implemented as a logic-based combining circuit that combines the clock signal phases (which can be square-wave pulses) from the RTWO. For example, the edge combiner can include parallel stacks of transistors operating on different clock signal phases, with the stacks pulling down (or up) an output node to generate the output clock signal of multiplied frequency.

In one aspect, a frequency multiplier includes an RTWO including a differential transmission line connected as a ring, the differential transmission line configured to carry a traveling wave, wherein the RTWO is configured to generate a plurality of clock signal phases of a first frequency. The frequency multiplier further includes an edge combiner configured to receive the plurality of clock signal phases and to generate an output clock signal having a second frequency that is a multiple of the first frequency.

In another aspect, a method of frequency multiplication is provided. The method includes generating a plurality of clock signal phases of a first frequency using an RTWO that includes a differential transmission line connected as a ring, providing the plurality of clock signal phases from the ring of the RTWO to an edge combiner, and combining the plurality of clock signal phases to generate an output clock signal having a second frequency that is a multiple of the first frequency using the edge combiner.

In another aspect, a frequency multiplier includes an RTWO including a differential transmission line connected as a ring, the differential transmission line configured to carry a traveling wave, wherein the RTWO is configured to generate a plurality of clock signal phases of a first frequency. The frequency multiplier further includes means for edge combining the plurality of clock signal phases to generate an output clock signal having a second frequency that is a multiple of the first frequency.

DETAILED DESCRIPTION OF EMBODIMENTS

Figure 1A:
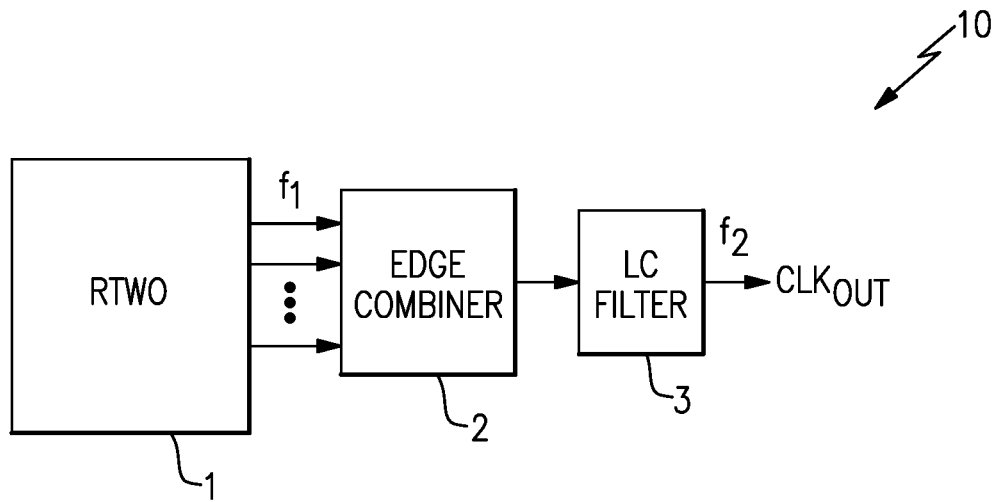
FIG. 1A is a schematic diagram of an RTWO-based frequency multiplier according to one embodiment.

The following detailed description of embodiments presents various descriptions of specific embodiments of the invention. However, the invention can be embodied in a multitude of different ways. In this description, reference is made to the drawings, where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As persons having ordinary skill in the art will appreciate, a rotary traveling wave oscillator (RTWO) includes a differential transmission line connected in a ring with an odd number of one or more crossovers (for instance, a Mobius ring), and a plurality of maintaining amplifiers electrically connected along a path of the differential transmission line. Additionally, each of the crossovers reverses the polarity of a wave propagating along the differential transmission line, and the maintaining amplifiers provide energy to the wave to compensate for the differential transmission line's losses.

In certain implementations, the ring is partitioned into segments evenly distributed around the ring, with each segment including a pair of conductors extending from the differential transmission line and to which a maintaining amplifier and at least one tuning capacitor array are connected between. For example, the maintaining amplifier can be implemented using a pair of back-to-back inverters that compensate for the segment's losses and ensure differential operation, while the tuning capacitor array serves to tune the oscillation frequency of the RTWO over a wide tuning range and/or to provide a fine frequency step size.

RTWOs can be used in a variety of applications, including, for example, radio frequency systems, optical networks, and/or chip-to-chip communication. For instance, an RTWO can be used in a frequency synthesizer to generate an output clock signal having a controlled phase and frequency relationship to a reference clock signal.

An RTWO has an ability to generate multiple clock signal phases at millimeter-wave (mmW) frequencies, while achieving low phase noise (PN). For example, RTWO's can be used as a local oscillator (LO) in mmW radars operating in the 77-81 GHz band.

In certain applications, a clock signal from an RTWO is multiplied using a frequency multiplier. However, such frequency multiplication can be difficult to achieve without degrading performance parameters, particularly when the multiplication factor is greater than two.

For example, cascading conventional frequency doublers is not power-efficient and/or suffers from challenges in designing inter-stage matching circuits for rejecting unwanted spurious harmonics. Additionally, cascading doublers is not area efficient since isolation between doublers should be maintained to avoid subharmonic coupling.

Conventional frequency quadruplers can also be used, but suffer from a number of drawbacks including, but not limited to, poor DC-to-RF efficiency.

RTWO-based frequency multipliers are provided herein. In certain embodiments, an RTWO-based frequency multiplier includes an RTWO that generates a plurality of clock signal phases of a first frequency, and an edge combiner that processes the clock signal phases to generate an output clock signal having a second frequency that is a multiple of the first frequency. The edge combiner can be implemented as a logic-based combining circuit that combines the clock signal phases (which can be square-wave pulses) from the RTWO. For example, the edge combiner can include parallel stacks of transistors operating on different clock signal phases, with the stacks pulling down (or up) an output node to generate the output clock signal of multiplied frequency.

In certain implementations, the output of the edge combiner is coupled to inductor-capacitor (LC) filter. Such an LC filter can have an impedance that is tunable based on an oscillation frequency of the RTWO. For example, in an implementation in which the RTWO-based frequency multiplier is a frequency quadrupler, the impedance of the LC filter can be tuned to about four times the RTWO's oscillation frequency.

Including the edge combiner allows frequency multiplication to be achieved while running the RTWO at a relatively low oscillation frequency. Implementing the RTWO at lower frequency achieves a number of benefits including, but not limited to, low transmission line losses, a larger number of segments, and/or clock signal phases closer to ideal square waveforms.

In certain implementations, controllable components, such as correction capacitors placed in the RTWO's segments, are used to correct for phase error mismatch of the clock signal phases provided to the edge combiner. The values of such controllable components can be set in a variety of ways. In a first example, a harmonic in the output clock signal (for example, a fifth harmonic) is observed and the controllable components are adjusted to reduce or minimize the power level of the harmonic. In a second example, digital data from a time-to-digital converter (TDC) is processed by a finite state machine (FSM) to set the values of the controllable components. The FSM can monitor the digital data from the TDC using any suitable metric for providing phase alignment.

In certain implementations, the edge combiner is placed inside the ring of the RTWO, thereby aiding in providing balanced routes for routing the clock signal phases from the RTWO's ring to the edge combiner. In certain implementations, an output buffer is included for buffering the output clock signal from the edge combiner.

In one example application, an RTWO-based frequency multiplier serves as a frequency quadrupler that combines four square-wave pulses (each of which can be differential) from a co-located 10-GHz RTWO in order to generate an output clock signal at 40 GHz with good harmonic rejection of RTWO harmonics. Such an RTWO-based frequency quadrupler can be followed by a frequency doubler to generate an LO signal suitable for servicing the 77-81 GHz band, for instance, for a radar application. Although one specific application of an RTWO-based frequency multiplier is provided, the RTWO-based frequency multipliers disclosed herein can be used in a wide variety of applications.

FIG. 1A is a schematic diagram of an RTWO-based frequency multiplier 10 according to one embodiment. The frequency multiplier 10 includes an RTWO 1, an edge combiner 2, and an inductor-capacitor (LC) filter 3. An edge combiner, such as the edge combiner 2 of FIG. 1A, is also referred to herein as an edge combining circuit.

In the illustrated embodiment, the RTWO 1 provides various clock signal phases of a frequency $f_1$ to the edge combiner 2. Each of the clock signal phases has a different phase, and are obtained from tapping a ring of the RTWO 1 at different positions. The clock signal phases can be singled-ended or differential signals. In certain implementations, the clock signal phases are provided from the output of buffers distributed around the ring at different positions. For example, an input of such a buffer can be connected to a particular position along the ring, and an output of the buffer can provide a clock signal phase of a desired value.

The frequency $f_1$ of the clock signal phases is set by a period of the traveling wave propagating around the RTWO's ring. The RTWO 1 can include controllable capacitors (for example, tuning capacitor arrays in the RTWO's segments) that can be controlled to set the frequency $f_1$ to a desired value.

As shown in FIG. 1A, the edge combiner 2 receives the clock signal phases from the RTWO 1, and combines the clock signal phases to generate an output clock signal $CLK_{OUT}$ that is filtered by the LC filter 3. The output clock signal $CLK_{OUT}$ has a second frequency $f_2$ that is a multiple of the first frequency $f_1$. The LC filter 3 can be included and tuned to the second frequency $f_2$ to provide filtering that enhances the spectral purity of the output clock signal $CLK_{OUT}$. However, other implementations are possible.

The output clock signal $CLK_{OUT}$ is a multiple of the RTWO's frequency. For example, the frequency multiplier 10 can serve to provide, frequency doubling, frequency tripling, frequency quadrupling, or any other desired frequency multiplication. Moreover, in comparison to conventional frequency multipliers, the RTWO-based frequency multiplier 10 provides frequency multiplication with high DC-to-RF efficiency.

Figure 1B:
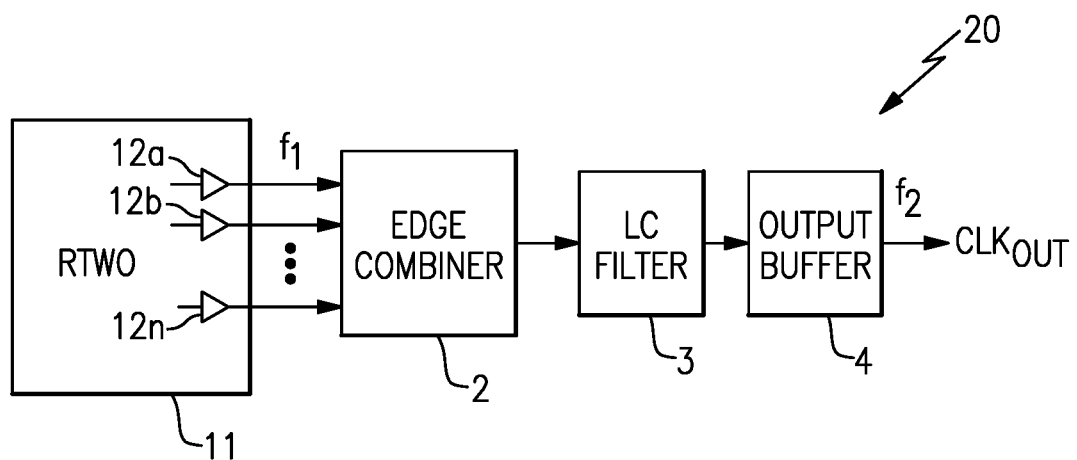
FIG. 1B is a schematic diagram of an RTWO-based frequency multiplier according to another embodiment.

FIG. 1B is a schematic diagram of an RTWO-based frequency multiplier 20 according to another embodiment. The frequency multiplier 20 includes an RTWO 11, an edge combiner 2, an LC filter 3, and an output buffer 4.

The frequency multiplier 20 of FIG. 1B is similar to the frequency multiplier 10 of FIG. 1A, except that the frequency multiplier 20 includes an RTWO 11 including buffers 12a, 12b, . . . 12n for generating the clock signal phases provided to the edge combiner 2. Including the buffers 12a, 12b, . . . 12n aids in providing isolation between the edge combiner 2 and the RTWO's ring, thereby reducing loading of the ring. The frequency multiplier 20 further includes the output buffer 4 for buffering the output clock signal $CLK_{OUT}$.

Figure 2A:
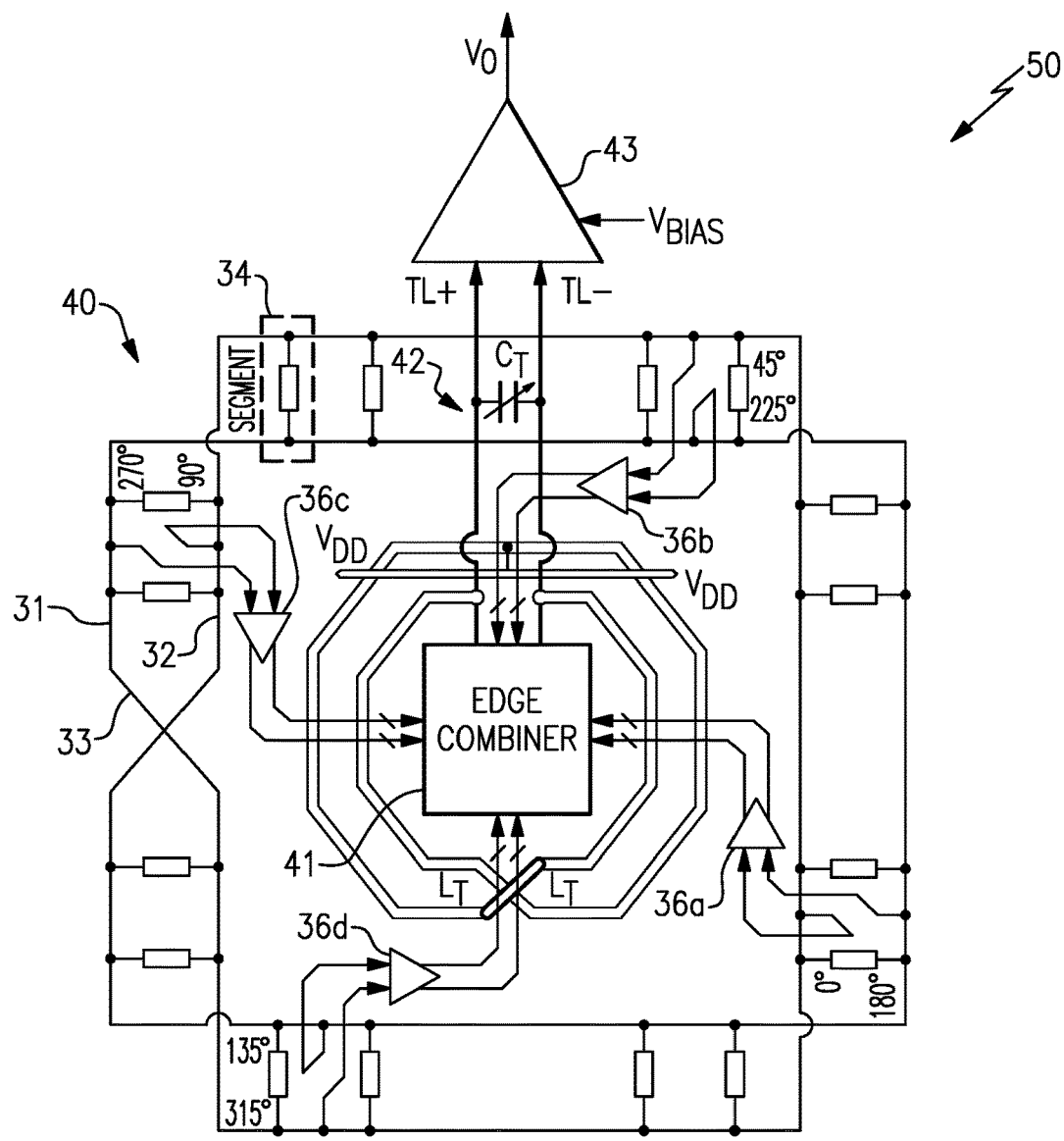
FIG. 2A is a schematic diagram of an RTWO-based frequency multiplier according to another embodiment.

FIG. 2A is a schematic diagram of an RTWO-based frequency multiplier 50 according to another embodiment. The frequency multiplier 50 includes an RTWO 40, an edge combiner 41, and LC filter 42, and an output buffer 43.

In the illustrated embodiment, the RTWO 40 includes a differential transmission line including a first conductor 31 and a second conductor 32. As shown in FIG. 2A, the differential transmission line 31-32 is connected in a closed-loop or ring, and the differential transmission line includes a crossover 33 to provide inversion to a traveling wave propagating around the ring. Various phases of the traveling wave have been annotated along the differential transmission line 31-32. The RTWO 40 of FIG. 2A further includes a plurality of segments, one such segment 34 is indicated in FIG. 2A.

In the illustrated embodiment, the RTWO's differential transmission line 31-32 is connected in a closed-loop and is folded at each of four corners. However, the RTWO's differential transmission line can be implemented in other ways, including, for example, different implementations of folding and/or routing of the conductors 31 and 32.

The RTWO 40 further includes a first differential buffer 36a, a second differential buffer 36b, a third differential buffer 36c, and a fourth differential buffer 36d used to provide various clock signal phases to the edge combiner 41. In the example, the buffers 36a-36d each have differential inputs and differential outputs. However, other implementations are possible, for example, single-ended input/differential output, single-ended input/single-ended output, or differential input/single-ended output.

In the embodiment of FIG. 2A, the differential buffers 36a-36d provide clock signal phases of 0°, 45°, 90°, 135°, 180°, 225°, 270°, and 315°. Thus, eight clock signal phases spanning 360° and separated by about 45° are provided from the RTWO 40 to the edge combiner 41, in this example. However, other implementations are possible. For example, an RTWO can provide more or fewer clock signal phases to the edge combiner 41 and/or clock signals of different phase values.

The edge combiner 41 processes the clock signal phases to generate a differential clock signal provided on a differential transmission line $TL_+$, $TL_-$. The differential clock signal is filtered by the LC filter 42. As shown in FIG. 2A, the LC filter 42 includes a tunable capacitor $C_T$ and an inductor $L_T$ that operate in combination with one another to filter the differential clock signal. In the embodiment of FIG. 2, the edge combiner 41 and the LC filter 42 are positioned within the RTWO's ring, with the edge combiner 41 positioned at about the center of the RTWO's ring. Implementing the frequency multiplier 50 in this manner aids in balancing the length of conductors carrying the clock signal phases to the edge combiner 41. Accordingly, low phase error of the clock signal phases is achieved.

In the embodiment of FIG. 2A, the LC filter 42 includes the tunable capacitor $C_T$. The capacitance of the tunable capacitor $C_T$ can be adjusted for a variety of reasons, including, but not limited to, to adjust the impedance of the LC filter 42 based on an oscillation frequency of the RTWO 40. For example, in certain implementations, the RTWO's segments 34 include tunable capacitor arrays that are adjustable to set the oscillation frequency of the RTWO 41, and the value of the tunable capacitor $C_T$ is set based on the selected capacitance values of the tunable capacitor arrays in the segments 34. Additionally or alternatively, the tunable capacitor $C_T$ can be set to account for process, temperature, and/or voltage (PVT) variation.

In the illustrated embodiment, the LC filter 42 also receives a supply voltage $V_{DD}$ used to power the edge combiner 41. In particular, the inductor $L_T$ is implemented as metal coil winding around the edge combiner 41 and having a center tap that receives the supply voltage $V_{DD}$. Accordingly, the inductor $L_T$ is also used as a radio frequency choke for providing a DC supply voltage to the edge combiner 41, in this example. However, other implementation are possible.

With continuing reference to FIG. 2A, the frequency multiplier 50 further includes the output buffer 43 for buffering the differential clock signal received from the differential transmission line $TL_+$, $TL_-$ to generate an output clock signal Vo. For example, although the output buffer 43 of FIG. 2A includes a differential input and a single-ended output, an output buffer can be implemented in other ways, for instance, with a single-ended input/differential output, single-ended input/single-ended output, or a differential input/differential output. Accordingly, other implementations are possible.

The output buffer 43 is biased by a bias voltage $V_{BIAS}$, in this example. In certain implementations, one or more parameters of the output buffer 43 (such as a bias, resonance, impedance, etc.) are adjusted based on a selected oscillation frequency of the RTWO 41. Accordingly, the output buffer 43 is tuned based on an oscillation frequency of the RTWO 41, in some embodiments.

Figure 2B:
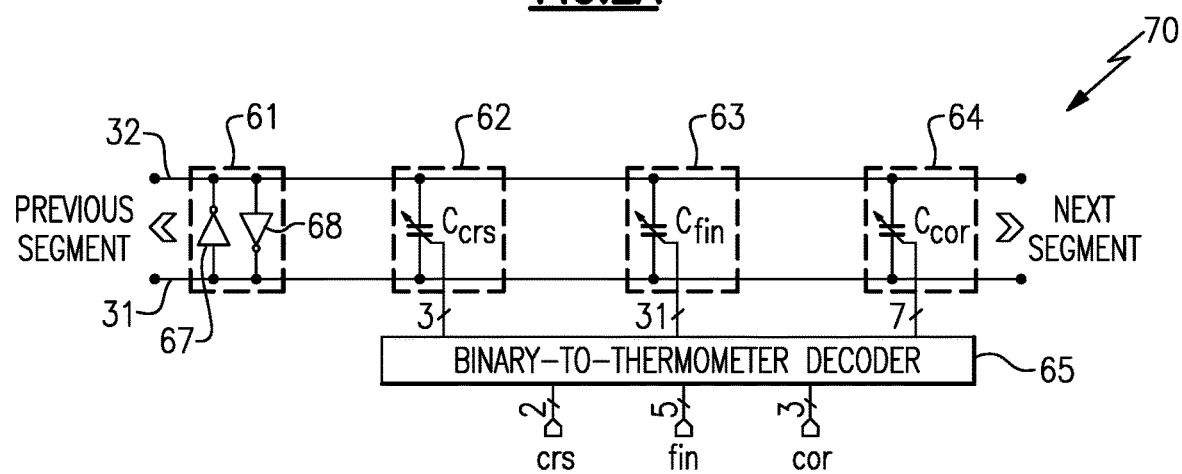
FIG. 2B is a schematic diagram of one embodiment of a segment for an RTWO.

FIG. 2B is a schematic diagram of one embodiment of a segment 70 for an RTWO. The segment 70 includes a maintaining amplifier 61, a coarse capacitor array 62, a fine capacitor array 63, a correction capacitor array 64, and a segment decoder 65.

The segment 70 of FIG. 2B illustrates one embodiment of the segment 34 of the RTWO 40 of FIG. 2A. Although one example of an RTWO segment is depicted, the teachings herein are applicable to segments implemented in a wide variety of ways. Accordingly, other implementations are possible.

As shown in FIG. 2B, the segment 70 is depicted as being connected between a first conductor 31 and a second conductor 32 of a differential transmission line of an RTWO.

In the embodiment of FIG. 2B, the maintaining amplifier 61 includes a first inverter 67 having an input connected to the first transmission line 31 and an output connected to the second transmission line 32, and a second inverter 68 having an input connected to the second transmission line 32 and an output connected to the first transmission line 31. The maintaining amplifier 61 serves to provide energy to a traveling wave propagating along the RTWO's differential transmission line. Although one example of a maintaining amplifier is depicted, a maintain amplifier can be implemented in other ways.

In the illustrated embodiment, the coarse capacitor array 62 includes an array of three selectable coarse capacitors of capacitance $C_{crs}$, while the fine capacitor array 63 includes an array of thirty-one selectable fine capacitors of capacitance $C_{fin}$. The segment decoder 65 controls the capacitance values of the coarse capacitor array 62 and the fine capacitor array 63 based on a coarse control word (crs, 2-bit, in this example) and a fine control word (fin, 5-bit, in this example). The segment decoder 65 is implemented with thermometer decoding, in this embodiment. By controlling a capacitance of the coarse capacitor array 62 and the fine capacitor array 63, an oscillation frequency of the RTWO is controlled.

The segment 70 of FIG. 2B also includes the correction capacitor array 64. In this example, the correction capacitor array 64 includes an array of seven selectable coarse capacitors of capacitance $C_{cor}$, which are controlled by the segment decoder 65 based on a correction control word (cor, 3-bit, in this example). The segment decoder 65 can set the correction capacitor array 64 to provide correction for a variety of errors, including, but not limited to, correcting for PVT variations and/or correcting the phase of a clock signal provided to an edge combiner.

Accordingly, in some embodiments, the correction capacitor array 64 is used to provide phase adjustments to clock signal phases used by an edge combiner of an RTWO-based frequency multiplier.

Figure 3A:
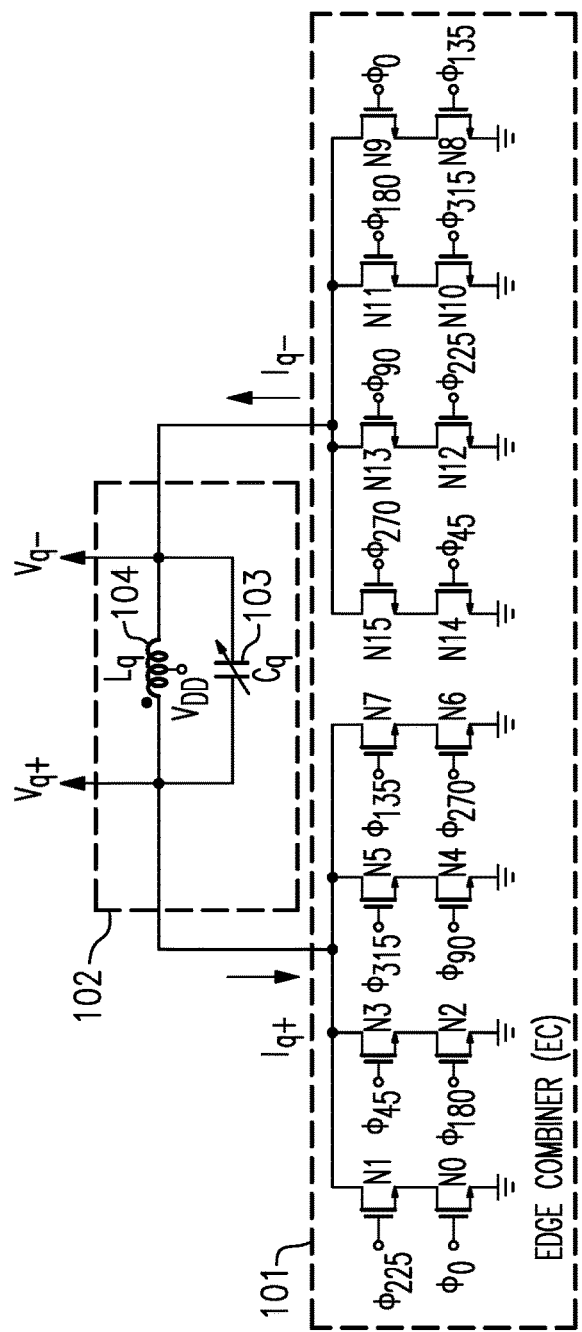
FIG. 3A is a schematic diagram of an edge combiner and an inductor-capacitor (LC) filter according to one embodiment.

FIG. 3A is a schematic diagram of an edge combiner 101 and an LC filter 102 according to one embodiment. Although specific implementations of an edge combiner and LC filter are depicted, the teachings herein are applicable to edge combiners and LC filters implemented in a wide variety of ways.

In the illustrated embodiment, the edge combiner 101 is implemented differentially and includes a first half circuit connected between a non-inverted output terminal $V_{q+}$ and ground, and a second half circuit connected between an inverted output terminal $V_{q-}$ and ground. Although a differential edge combiner is depicted, the teachings herein are also applicable to single-ended configurations.

The first half circuit includes n-type field-effect transistors (NFETs) N0, N1, N2, N3, N4, N5, N6, and N7, while the second half circuit includes NFETs N8, N9, N10, N11, N12, N13, N14, and N15. NFETs N0 and N1 are connected in series in a first stack, NFETs N2 and N3 are connected in series in a second stack, NFETs N4 and N5 are connected in series in a third stack, and NFETs N6 and N7 are connected in series in a fourth stack, with the first through fourth stacks connected in parallel with one another between the non-inverted output terminal $V_{q+}$ and ground. Additionally, NFETs N8 and N9 are connected in series in a fifth stack, NFETs N10 and N11 are connected in series in a sixth stack, NFETs N12 and N13 are connected in series in a seventh stack, and NFETs N14 and N15 are connected in series in an eight stack, with the fifth through eighth stacks connected in parallel with one another between the inverted output terminal $V_{q-}$ and ground.

As shown in FIG. 3A, the NFETs N0, N1, N2, N3, N4, N5, N6, and N7 receive clock signal phases $\varphi_0$, $\varphi_{225}$, $\varphi_{180}$, $\varphi_{145}$, $\varphi_{90}$, $\varphi_{315}$, $\varphi_{270}$, and $\varphi_{135}$, respectively, where the subscript indicates the phase (in degrees) of a given clock signal phase. Additionally, the NFETs N8, N9, N10, N11, N12, N13, N14, and N15 receive clock signal phases $\varphi_{135}$, $\varphi_0$, $\varphi_{315}$, $\varphi_{180}$, $\varphi_{225}$, $\varphi_{90}$, $\varphi_{45}$, and $\varphi_{270}$, respectively. The NFETs can be implemented in a wide variety of ways including, but not limited to, using n-type metal-oxide-semiconductor (NMOS) transistors. Although an implementation with n-type transistors is shown, an edge combiner can be implemented in other ways, such as configurations using p-type transistors or a combination of n-type and p-type transistors.

Accordingly, the first half circuit of the edge combiner 101 includes four pairs of NFET transistors that selectively activated based on timing of the clock signal phases to generate a first current $I_{q+}$ used to pull down the non-inverted output terminal $V_{q+}$. Additionally, the second half circuit of the edge combiner 102 includes another four pairs of NFET transistors that selectively activate based on timing of the clock signal phases to generate a second current $I_{q-}$ used to pull down the inverted output terminal $V_{q-}$. The first current $I_{q+}$ and the second current $I_{q-}$ correspond to differential components of an output current having a frequency that is a multiple (four times, in this example) of the frequency of the clock signal phases.

In the illustrated embodiment, the LC filter 102 includes a tunable capacitor array 103 and an inductor 104. The tunable capacitor array 103 includes a plurality of selectable capacitors of capacitance $C_q$, while the inductor 104 has an inductance 104. The tunable capacitor array 103 and the inductor 104 are connected in parallel with one another between the non-inverted output terminal $V_{q+}$ and the inverted output terminal $V_{q-}$. Although an example of an LC filter with a tunable capacitor and a fixed inductor is shown, other implementations are possible, including configurations in which an inductor is tunable (for instance, by way of selectable inductors).

Figure 3B:
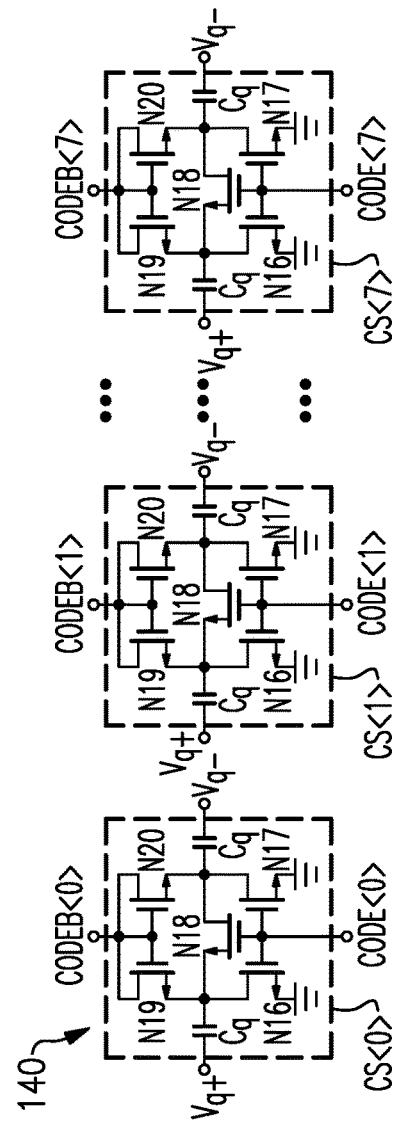
FIG. 3B is a schematic diagram of one embodiment of a tunable capacitor array of an LC filter.

FIG. 3B is a schematic diagram of one embodiment of a tunable capacitor array 140. The tunable capacitor array 140 illustrates one example implementation of the tunable capacitor array 103 of FIG. 3A. A similar implementation can be used to implement any of the other tunable capacitor arrays used herein, for example, tunable capacitor arrays of an RTWO's segments. Although one example of a tunable capacitor array is depicted, other implementations of tunable capacitor arrays are possible.

In the example of FIG. 3B, the tunable capacitor array 140 includes eight slices or instantiations of circuitry, with each instantiation controlled by a different control bit (code) and inverted control bit (codeb) for tuning.

In particular, the tunable capacitor array 140 includes slices CS<0>, CS<1>, ... CS<7>. Additionally, the slices CS<0>, CS<1>, ... CS<7> receive control bits code<0>, code<1>, ... code<7>, respectively, and inverted control bits codeb<0>, codeb<1>, ... codeb<7>, respectively.

Each slice of the tunable capacitor array 140 is implemented using NFET transistors N16, N17, N18, N19, and N20 and using a differential implementation of metal-oxide-metal (MOM) capacitors with capacitance $C_q$. Each slice is connected between the non-inverted terminal $V_{q+}$ and the inverted terminal $V_{q-}$.

Figure 3C:
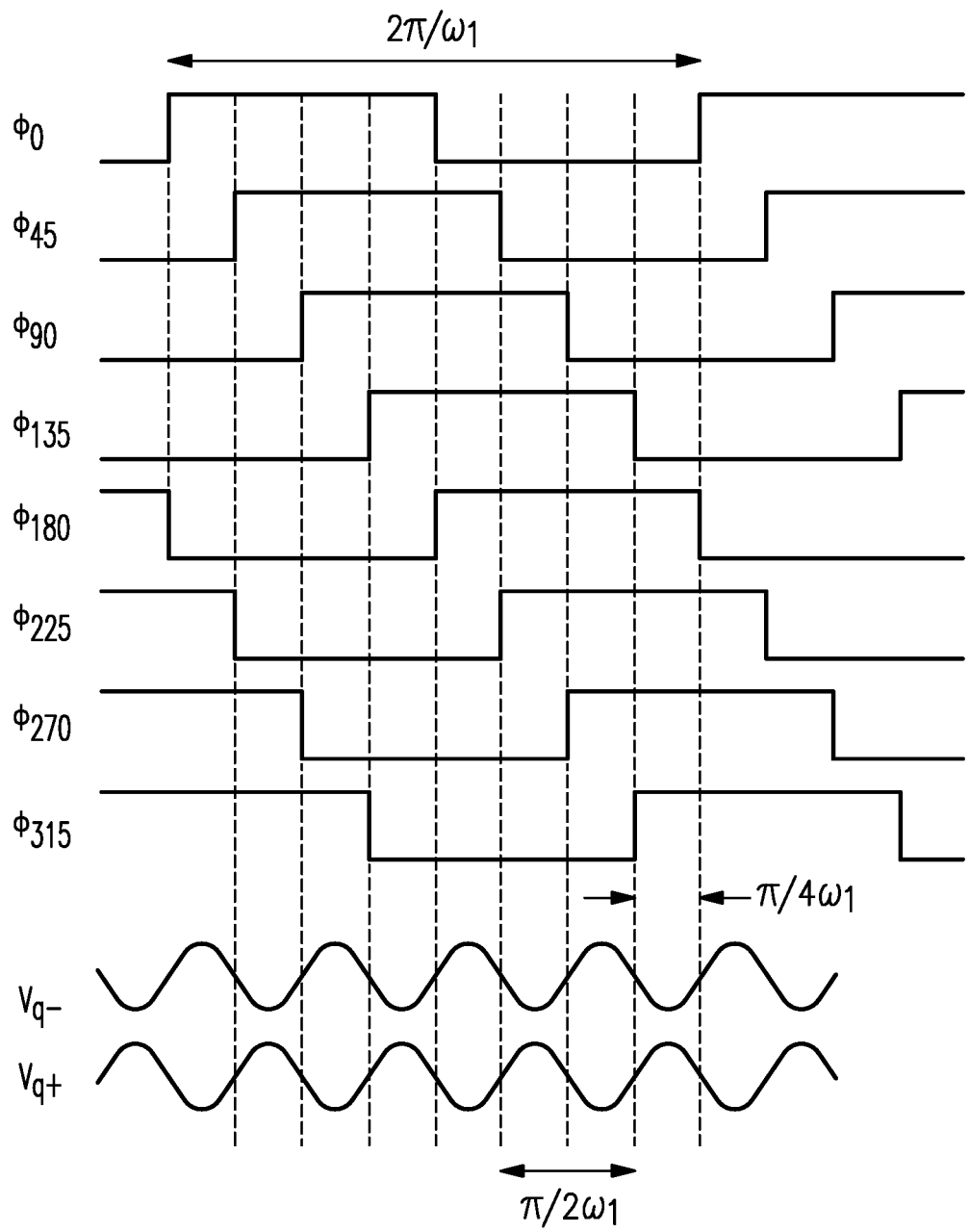
FIG. 3C is one example of timing diagrams for an edge combiner.

FIG. 3C is one example of timing diagrams for an edge combiner. The timing diagrams depict one example of operation of the edge combiner 101 of FIG. 3A, with clock signal phases for the first half circuit depicted. As shown in FIG. 3C, the clock signal phases have period $2\pi/\omega_1$, where $\omega_1$ is the angular frequency ($\omega=2\pi f$) of the RTWO. Additionally, the output clock signal (corresponding to a differential signal between $V_{q+}$ and $V_{q-}$, in this example) has a period of $\pi/(2\omega_1)$. Thus, frequency quadrupling is provided, in this example. Due to LC filtering, the output clock signal is sinusoidal.

Figure 4:
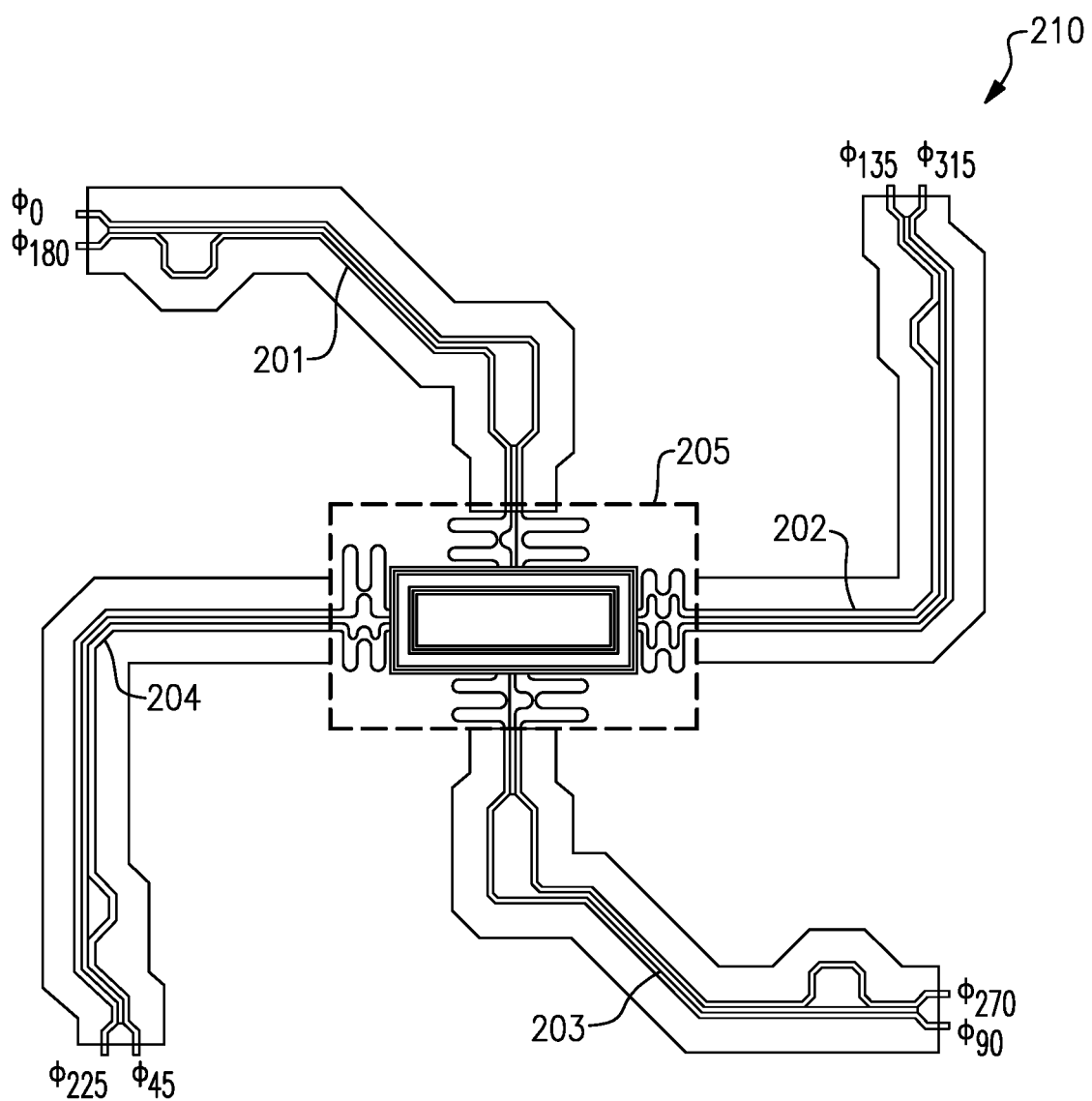
FIG. 4 is a schematic diagram of a clock tree layout for an RTWO-based frequency multiplier according to one embodiment.

FIG. 4 is a schematic diagram of a clock tree layout 210 for an RTWO-based frequency multiplier according to one embodiment. The clock tree layout 210 includes a first pair of metal clock routes 201, a second pair of metal clock routes 202, a third pair of metal clock routes 203, a fourth pair of metal clock routes 204, and an edge combiner layout 205.

As shown in FIG. 4, the first pair of metal clock routes 201 are used to provide clock signal phases $\varphi_0$ and $\varphi_{180}$ from an RTWO ring to the edge combiner layout 205. Additionally, the second pair of metal clock routes 202 are used to provide clock signal phases $\varphi_{135}$ and $\varphi_{315}$ from the RTWO ring to the edge combiner layout 205. Furthermore, the third pair of metal clock routes 203 are used to provide clock signal phases $\varphi_{270}$ and $\varphi_{90}$ from the RTWO ring to the edge combiner layout 205. Additionally, the fourth pair of metal clock routes 204 are used to provide clock signal phases $\varphi_{225}$ and $\varphi_{45}$ from the RTWO ring to the edge combiner layout 205.

In the illustrated embodiment, each pair of metal clock routes has a balanced or matched length to aid in matching a propagation delay of the clock signal phases to the edge combiner layout 205.

In certain implementations, tunable components are provided for correcting for phase error of one or more of the clock signal phases, thereby aligning the actual clock signal phase with a desired or ideal phase value (as indicated by the subscript). Examples of such tunable components include, but are not limited to, correction capacitors in the RTWO segments (for example, to provide a local capacitance correction near a point at which a given clock signal phase is tapped from the RTWO's ring) and/or components for adjusting a delay of buffers used to provide the clock signal phases from the RTWO ring to the edge combiner.

In certain implementations, grounded shields are included in the pairs of metal clock routes 201-204 to provide shielding for reducing noise. For example, in the illustrated embodiment, grounded conductors are positioned beneath each pair of metal clock routes. The grounded conductors are routed with each pair of metal clock routes and correspond to one example of a grounded shield.

Figure 5:
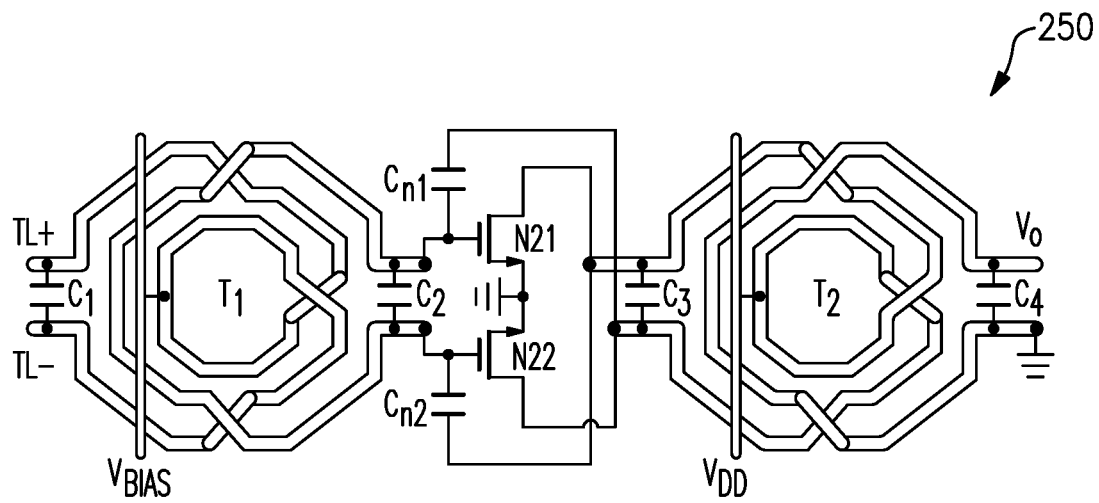
FIG. 5 is a schematic diagram of one embodiment of an output buffer for an RTWO-based frequency multiplier.

FIG. 5 is a schematic diagram of one embodiment of an output buffer 250 for an RTWO-based frequency multiplier. The output buffer 250 includes an input transformer T1, an output transformer T2, NFET N21, NFET N22, capacitor $C_1$, capacitor $C_2$, capacitor $C_3$, capacitor $C_4$, capacitor $C_{n1}$, and capacitor $C_{n2}$.

In the illustrated embodiment, the input transformer T1 includes a differential input that receives a differential input signal from a differential transmission line $TL_+$, $TL_-$. The input transformer T1 further includes a differential output that provides a differential output signal across the gates of NFETs N21 and N22. The differential input is connected to a first winding of the input transformer T1, while the differential output is connected to a second winding of the input transformer T1. The capacitor $C_1$ is connected across the differential input of the input transformer T1, while the capacitor $C_2$ is connected across the differential output of the input transformer T1. Additionally, a bias voltage $V_{BIAS}$ is provided at a center tap of the first winding to aid in controlling a common-mode voltage of the differential transmission line $TL_+$, $TL_-$.

With continuing reference to FIG. 5, the NFETs N21 and N22 amplify the signal from the input transformer T1 to generate an amplified signal that is provided to the output transformer T2. As shown in FIG. 5, the capacitor $C_{n1}$ is connected from a gate of NFET N21 to a drain of NFET N22, while the capacitor $C_{n2}$ is connected from a gate of NFET N22 to a drain of NFET N21.

The output transformer T2 receives the amplified signal from the NFETs N21 and N22 at a differential input, and provides an output signal Vo from one terminal of a differential output (with the other terminal of the differential output grounded, in this example). The capacitor $C_3$ is connected across the differential input of the output transformer T2, while the capacitor $C_4$ is connected across the differential output of the output transformer T2. The differential input is connected to a first winding of the output transformer T2, while the differential output is connected to a second winding of the output transformer T2. Additionally, a power supply voltage $V_{DD}$ is provided at a center tap of the first winding of the output transformer T2 to aid in powering the NFETs N21 and N22.

Although one embodiment of an output buffer is depicted, the teachings herein are applicable to output buffers implemented in a wide variety of ways.

Figure 6:
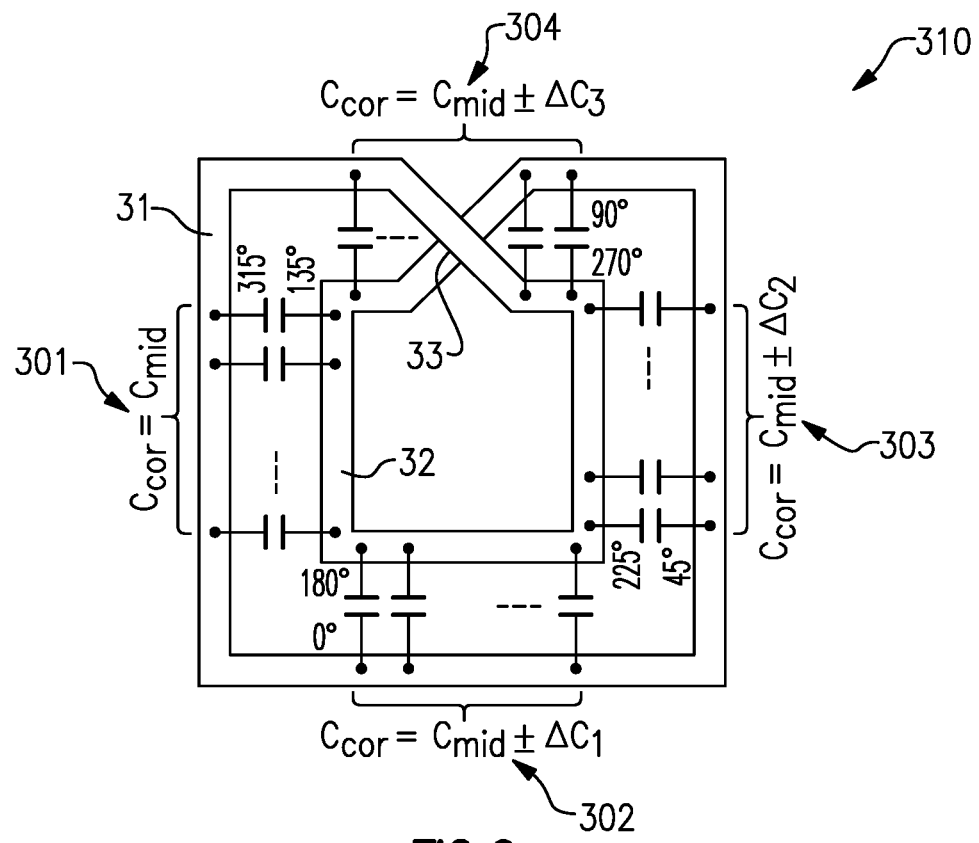
FIG. 6 is a schematic diagram of clock phase error tuning circuitry according to one embodiment.

FIG. 6 is a schematic diagram of clock phase error tuning circuitry 310 according to one embodiment. The clock phase error tuning circuitry 310 can be implemented in any of the RTWO-based frequency multipliers disclosed herein.

In the illustrated embodiment, an RTWO ring formed from conductors 31 and 32 and a crossover 33 is depicted. Additionally, capacitors associated with a first segment 301, a second segment 302, a third segment 303, and a fourth segment 304 are depicted.

There are many potential sources of phase error between the input clock signal phases to an edge combiner of an RTWO-based frequency multiplier. Examples of such sources of phase error include, but are not limited to, mismatch between the RTWO phases, asymmetric routing of a clock tree layout, local mismatches in the input buffers, local mismatches of the edge combiner's transistors, and/or asymmetric transmission line routing between the edge combiner and an output buffer.

To help alleviate such errors, correction components can be included. For example, in the embodiment of FIG. 6, correction capacitors (for example, a 3-bit MOM switched capacitor array) can be included for phase correction in each segment in order to correct any source of mismatch between the clock signal phases. Although an example using correction capacitors in RTWO segments is depicted, phase error can be compensated for in other ways including, but not limited to, by adjusting the delay of buffers used to provide the clock signal phases to an edge combiner. For example, controllable capacitors can be included at the output of buffers to provide such delay adjustment.

The values of the correction components (for example, capacitances of correction capacitor arrays in the RTWO's segments) can be provided in a wide variety of ways. In one example, RTWO phase calibration is performed by observing a fifth harmonic of the RTWO frequency at the system output.

In the illustrated embodiment, the phase-correction MOM switched-capacitor array for each segment is set to its middle value $C_{mid}$. By fixing the phase-correction capacitance for the chosen side of the RTWO ring (left segment

301, in this example) and sequentially tuning the other sides by ΔC1 (8×3-bit control), ΔC2, and ΔC3, the RTWO clock phase signals can be aligned to desired phases values at the edge combiner's input, thereby significantly lowering the fifth harmonic level of the frequency multiplier.

Figure 7:
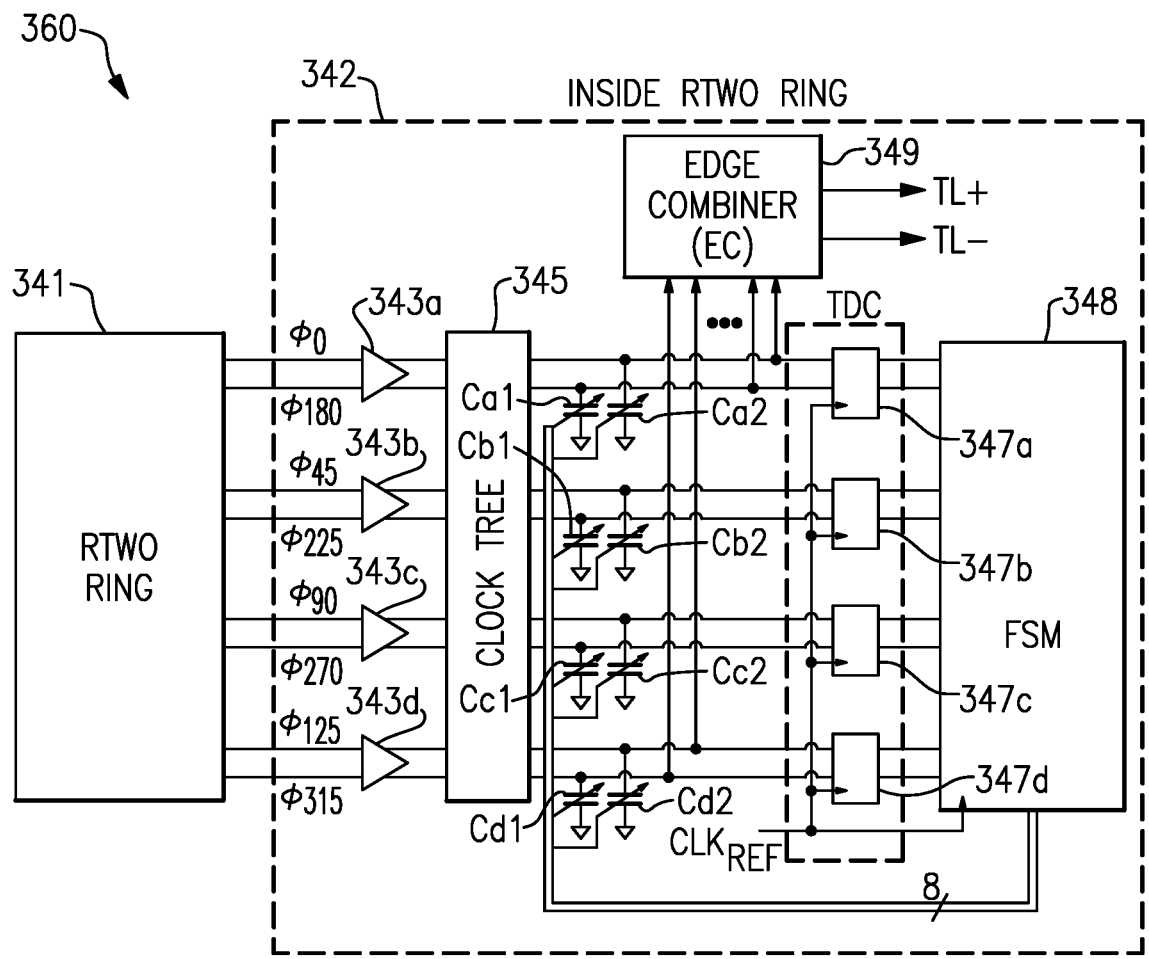
FIG. 7 is a schematic diagram of clock phase error tuning circuitry according to another embodiment.

FIG. 7 is a schematic diagram of clock phase error tuning circuitry 360 according to another embodiment. The clock phase error tuning circuitry 360 can be implemented in any of the RTWO-based frequency multipliers disclosed herein.

In the illustrated embodiment, an RTWO ring 341 is depicted as well as circuitry 342 implemented within the RTWO ring 341. The circuitry 342 within the RTWO ring 341 includes clock buffers 343a, 343b, 343c, and 343d, a clock tree 345, tuning capacitors Ca1, Ca2, Cb1, Cb2, Cc1, Cc2, Cd1, and Cd2, a time-to-digital converter (TDC) (implemented as TDC latches 347a, 347b, 347c, and 347d, in this embodiment), a finite-state machine (FSM) 348, and an edge combiner 349.

In the embodiment of FIG. 7, the TDC latches 347a, 347b, 347c, and 347d detect the timing of edge transitions of the clock signal phases provided to the edge combiner 349. The digital data indicating the times of edge transitions are processed by the FSM 348 to calibrate the phase error between four 45° phase-shifted differential signals by tapping the RTWO ring 341 using the clock buffers 343a, 343b, 343c, and 343d. The TDC latches 347a, 347b, 347c, and 347d are placed close to the edge combiner 349 so that the paths from the TDC inputs to the edge combiner inputs are short and of equal length. In certain implementations, the TDC latches 347a, 347b, 347c, and 347d are clocked by a reference signal having a frequency that is a fractional division of the RTWO's frequency.

During calibration, the RTWO frequency is locked at a prime fractional multiple of a reference clock $CLK_{REF}$ frequency used for controlling the FSM 348 and the TDC latches 347a, 347b, 347c, and 347d. Thus, an even distribution of TDC output codes is achieved. The outputs of the TDC latches 347a, 347b, 347c, and 347d are accumulated and the FSM 348 generates a histogram used to adjust the clock tree path delay by way of digitally-controlled capacitors, in this embodiment. For example, capacitor adjustment can be performed until the histogram bins are equalized.

Figure 8:
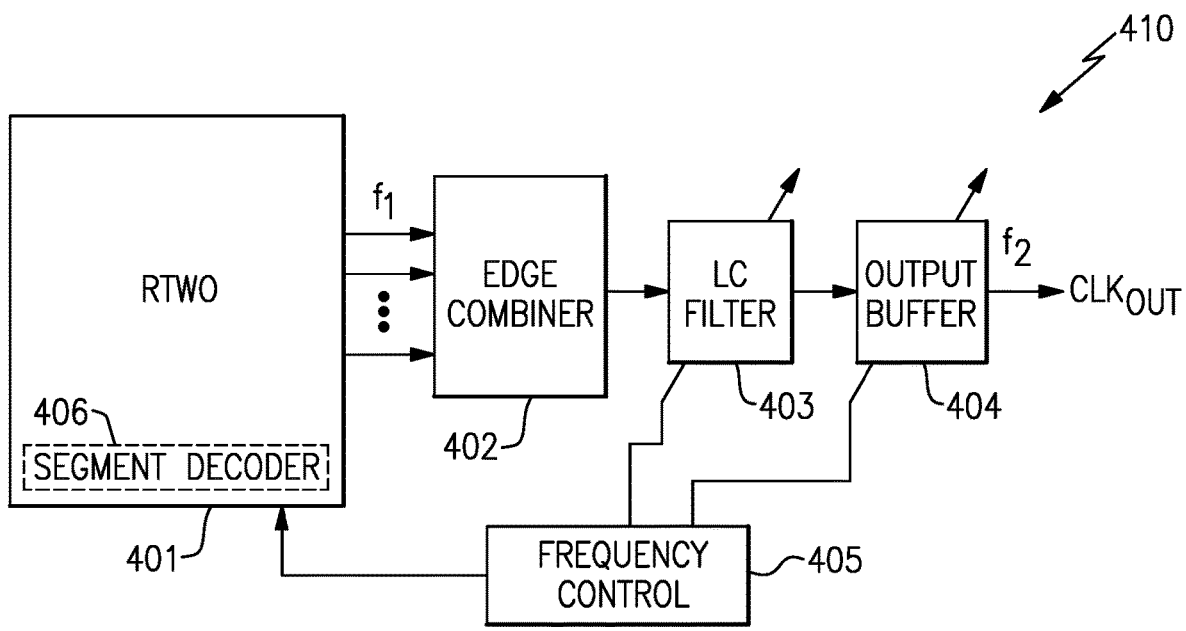
FIG. 8 is a schematic diagram of an RTWO-based frequency multiplier according to another embodiment.

FIG. 8 is a schematic diagram of an RTWO-based frequency multiplier 410 according to another embodiment. The frequency multiplier 410 includes an RTWO 401, an edge combiner 402, an LC filter 403, an output buffer 404, and a frequency control circuit 405.

The frequency multiplier 410 of FIG. 8 is similar to the frequency multiplier 20 of FIG. 1B, except that the frequency multiplier 410 further includes the frequency control circuit 405. The frequency control circuit 405 not only controls segment decoder circuitry 406 of the RTWO 401 (for example, a binary-to-thermometer decoder in each RTWO segment) to adjust an oscillation frequency $f_1$ of the RTWO 401, but also adjusts the LC filter 403 and/or the output buffer 404 based on the selected oscillation frequency $f_1$. In one example, an impedance of the LC filter 403 is tuned based on the selected oscillation frequency $f_1$.

Figure 9:
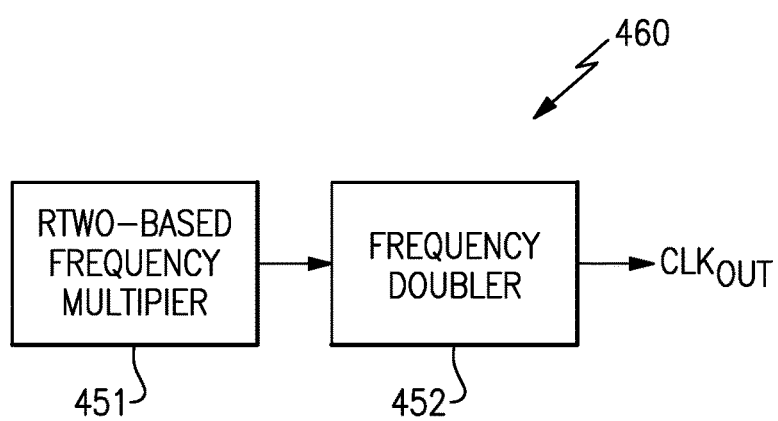
FIG. 9 is a schematic diagram of a frequency multiplication system according to one embodiment.

FIG. 9 is a schematic diagram of a frequency multiplication system 460 according to one embodiment. The frequency multiplication system 460 includes a cascade of an RTWO-based frequency multiplier 451 and a frequency doubler 452 to generate an output clock signal $CLK_{OUT}$. The RTWO-based frequency multiplier 451 can be implemented in accordance with any of the embodiments herein.

Figure 10A:
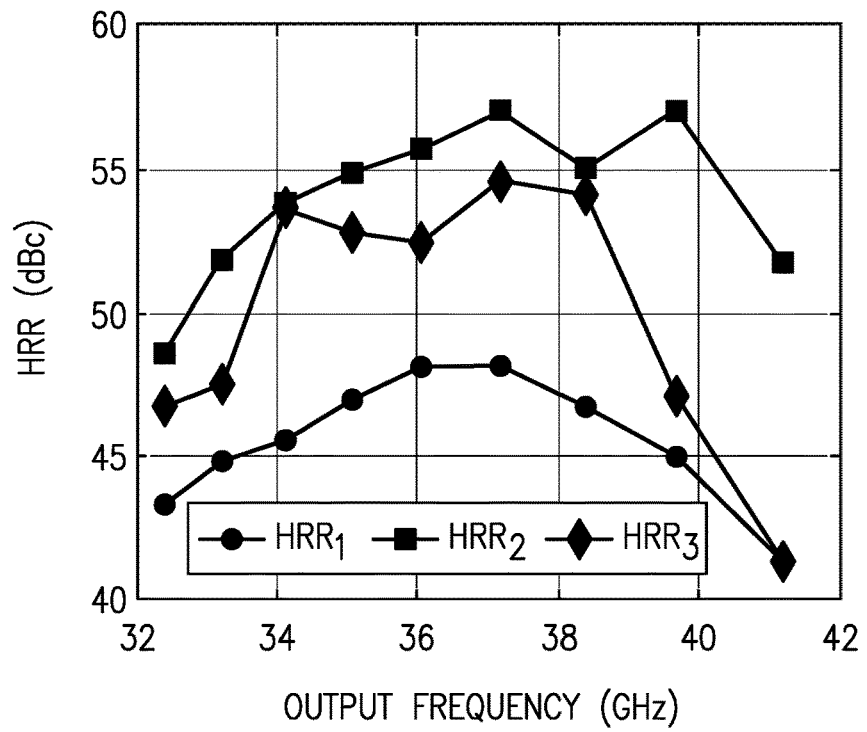
FIG. 10A illustrates one example of plots of harmonic rejection ratio (HRR) for fundamental, second, and third harmonics versus output frequency for one embodiment of an RTWO-based frequency multiplier.

FIG. 10A illustrates one example of plots of harmonic rejection ratio (HRR) for fundamental, second, and third harmonics versus output frequency for one embodiment of an RTWO-based frequency multiplier. The plots include fundamental HRR, second-harmonic HRR, and third-harmonic HRR for one implementation of an RTWO-based frequency multiplier in accordance with the embodiment of FIG. 2A.

Figure 10B:
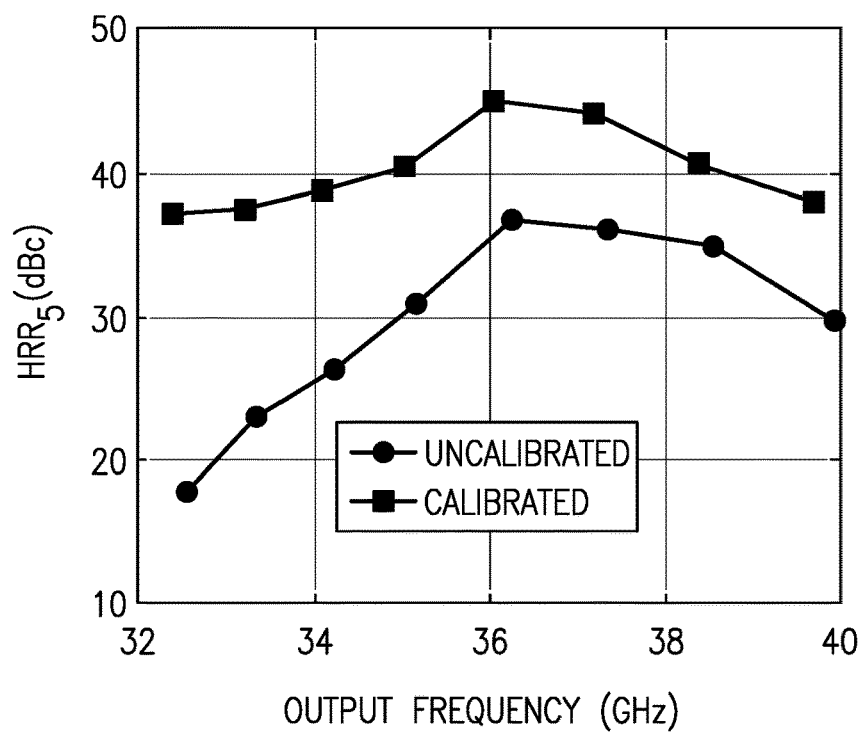
FIG. 10B illustrates one example of plots of fifth harmonic HRR versus output frequency with and without phase error calibration for one embodiment of an RTWO-based frequency multiplier.

FIG. 10B illustrates one example of plots of fifth harmonic HRR versus output frequency with and without phase error calibration for one embodiment of an RTWO-based frequency multiplier. The plots are depicted for an implementation of the RTWO-based frequency multiplier of FIG. 2A with and without phase error calibration in accordance with the embodiment of FIG. 6.

Applications

Devices employing the above described schemes can be implemented into various electronic devices. Examples of electronic devices include, but are not limited to, RF communication systems, consumer electronic products, electronic test equipment, communication infrastructure, radar systems, etc.

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. A frequency multiplier comprising:
   a rotary traveling wave oscillator (RTWO) including a differential transmission line connected as a ring, the differential transmission line configured to carry a traveling wave, wherein the RTWO is configured to generate a plurality of clock signal phases of a first frequency;
   an edge combiner configured to receive the plurality of clock signal phases and to generate an output clock signal having a second frequency that is a multiple of the first frequency;
   an inductor-capacitor (LC) filter configured to filter the output clock signal; and
   a control circuit configured control a center frequency of the LC filter to track the multiple of the first frequency.

2. The frequency multiplier of claim 1, wherein the edge combiner generates the output clock signal as a differential signal at a differential output, wherein the LC filter is coupled across the differential output.

3. The frequency multiplier of claim 1, wherein the RTWO further includes a plurality of controllable capacitors distributed around the ring, the control circuit further configured to control the first frequency based on setting a plurality of capacitance settings of the plurality of controllable capacitors.

4. The frequency multiplier of claim 1, wherein the edge combiner is positioned inside the ring.

5. The frequency multiplier of claim 1, wherein the RTWO further includes a plurality of buffers having a plurality of inputs coupled to the ring and a plurality of outputs configured to provide the plurality of clock signal phases to the edge combiner, wherein each of the plurality of clock signal phases has a different phase.

6. The frequency multiplier of claim 1, wherein the RTWO further includes a plurality of adjustable components configured to compensate the plurality of clock signal phases for phase error.

7. The frequency multiplier of claim 6 further comprising a time-to-digital converter (TDC) configured to generate a plurality of digital signals based on the plurality of clock signal phases, and a digital circuit configured to set a plurality of values of the plurality of adjustable components based on the plurality of digital signals.

8. The frequency multiplier of claim 1, wherein the edge combiner includes a plurality of transistors arranged in at least two parallel transistor stacks, wherein each of the plurality of transistors receives a different one of the plurality of clock signal phases.

9. The frequency multiplier of claim 1, wherein the plurality of clock signal phases includes a first group of clock signal phases and a second group of clock signal phases corresponding to an inverse of the first group of clock signal phases, wherein the edge combiner is configured to perform a plurality of digital logic operations on the first group of clock signal phases and the second group of clock signal phases.

10. The frequency multiplier of claim 9, wherein the plurality of logic operations comprise a plurality of logical AND operations each including a first clock signal phase from the first group of clock signal phases and a second clock signal phase from the second group of clock signal phases.

11. The frequency multiplier of claim 1 further comprising a plurality of time-to-digital converter (TDC) latches configured process the plurality of clock signal phases, and a plurality of adjustable components configured to compensate the plurality of clock signal phases for phase error mismatch based on a histogram of the outputs of the plurality of TDC latches.

12. A method of frequency multiplication, the method comprising:
   generating a plurality of clock signal phases of a first frequency using a rotary traveling wave oscillator (RTWO) that includes a differential transmission line connected as a ring;
   providing the plurality of clock signal phases from the ring of the RTWO to an edge combiner;
   combining the plurality of clock signal phases to generate an output clock signal having a second frequency that is a multiple of the first frequency using the edge combiner;
   filtering the output clock signal using an inductor-capacitor (LC) filter; and
   controlling a center frequency of the LC filter to track the multiple of the first frequency.

13. The method of claim 12, further comprising controlling the first frequency by controlling a plurality of controllable capacitors distributed around the ring.

14. The method of claim 12, further comprising compensating the plurality of clock signal phases for phase error mismatch using a plurality of adjustable components.

15. The method of claim 14, further comprising generating a plurality of digital signals by processing the plurality of clock signal phases using a plurality of time-to-digital converter (TDC) latches, and setting a plurality of values of the plurality of adjustable components based on the plurality of digital signals.

16. The method of claim 15, further comprising clocking the plurality of TDC latches using a reference signal at a third frequency that is a fractional division of the first frequency.

17. A method of frequency multiplication, the method comprising:
   generating a plurality of clock signal phases of a first frequency using a rotary traveling wave oscillator (RTWO) that includes a differential transmission line connected as a ring;
   providing the plurality of clock signal phases from the ring of the RTWO to an edge combiner;
   combining the plurality of clock signal phases to generate an output clock signal having a second frequency that is a multiple of the first frequency using the edge combiner;
   processing the plurality of clock signal phases using a plurality of time-to-digital converter (TDC) latches; and
   compensating the plurality of clock signal phases for phase error mismatch using a plurality of adjustable components, including determining a plurality of values of the plurality of adjustable components from a histogram of the outputs of the plurality of TDC latches.

18. The method of claim 17, further comprising filtering the output clock signal using an inductor-capacitor (LC) filter.

19. The method of claim 18, further comprising controlling an impedance of the LC filter.

20. The method of claim 17, further comprising controlling the first frequency by controlling a plurality of controllable capacitors distributed around the ring.

* * * * *